United States Patent [19]

Higuchi et al.

[11] Patent Number: 4,656,609
[45] Date of Patent: Apr. 7, 1987

[54] SEMICONDUCTOR MEMORY DEVICE

[75] Inventors: Mitsuo Higuchi, Tokyo; Ryoji Hagihara, Kawasaki, both of Japan

[73] Assignee: Fujitsu Limited, Kawasaki, Japan

[21] Appl. No.: 847,094

[22] Filed: Apr. 2, 1986

Related U.S. Application Data

[63] Continuation of Ser. No. 505,977, Jun. 20, 1983, abandoned.

[30] Foreign Application Priority Data

Jun. 30, 1982 [JP] Japan ................... 57-111522

[51] Int. Cl.[4] ............................................. G11C 11/40
[52] U.S. Cl. .................... 365/200; 365/210; 365/189
[58] Field of Search .............. 365/200, 72, 185, 189, 365/210

[56] References Cited

U.S. PATENT DOCUMENTS 4,313,106  1/1982  Hsu ........................... 340/825.91
4,422,161 12/1983  Kressel et al. ................... 365/200
4,489,402 12/1984  Saitoh et al. .................... 365/200

OTHER PUBLICATIONS

Dov Frohman-Bentchkowsky, FAMOS-A New Semiconductor Charge Storage Device, Solid-State Electronics, 1974, vol. 17, pp. 517-529.

Primary Examiner—Terrell W. Fears
Attorney, Agent, or Firm—Staas & Halsey

[57] ABSTRACT

A semiconductor memory device includes a redundancy decoder circuit. The redundancy decoder circuit includes FAMOS transistors to which an address pattern, corresponding to an address of a defective memory cell to be replaced by a redundancy memory cell, is written at the floating gates of the FAMOS transistors. The FAMOS transistors are depletion type. Control gates thereof receive a voltage having ground level or lower during a usual memory access mode.

7 Claims, 4 Drawing Figures

SEMICONDUCTOR MEMORY DEVICE

This is a continuation of co-pending application Ser. No. 505,977 filed on June 20, 1983, now abandoned.

BACKGROUND OF THE INVENTION (1) Field of the Invention

The present invention relates to a semiconductor memory device, more particularly to a semiconductor memory device including a redundancy decoder circuit.

(2) Description of the Prior Art

A recent trend in semiconductor memory devices is for higher integration. Along with this trend, it has become increasingly uneconomical to have to discard an entire memory due to, for example, a defect in a bit memory cell among the large number of memory cells in the device. Thus, in addition to the memory cell array, a one-bit redundancy memory is usually provided. When an address input specifies a defective memory cell, an address jump to the redundancy bit occurs. Therefore, although the memory cell array includes a defective memory cell, it can be used as a normal memory. A decoder circuit is useful for switching the address to the redundancy bit.

Various types of decoder circuits have been put into practical use, such as decoder circuits utilizing fuses or read only memories (ROM). The fuses are suitably fused or the content of the ROMs is suitably determined in such a manner as to change the output of the decoder circuit to logic "H" (high) only when an address corresponding to just the redundancy bit cell is received.

The redundancy decoder circuit to which the present invention is concerned does not utilize a fuse or ROM, but a floating-gate-avalanche-injection metal-oxide semiconductor (FAMOS) transistor. A FAMOS transistor is preferably used for a redundancy decoder circuit when a memory is fabricated as an erasable programmable read only memory (EPROM), in view of the use of common transistor elements for the EPROM and redundancy decoder circuit. This is because an EPROM is usually composed of FAMOS transistors.

A FAMOS transistor type redundancy decoder circuit has not yet been marketed commercially, however, it should come into practical use in the future.

SUMMARY OF THE INVENTION

It is an object of the present invention to provide a semiconductor memory device including a FAMOS transistor type redundancy decoder circuit suitable for practical use.

The above object is attained by using, not enhancement type FAMOS transistors, but depletion type FAMOS transistors, in addition, by commonly applying a voltage of ground level or lower to the control gates of the FAMOS transistors during a usual memory access mode.

BRIEF DESCRIPTION OF THE DRAWINGS

The present invention will be more apparent from the ensuing description with reference to the accompanying drawings, wherein.

DESCRIPTION OF THE PREFERRED EMBODIMENT

Figure 1:
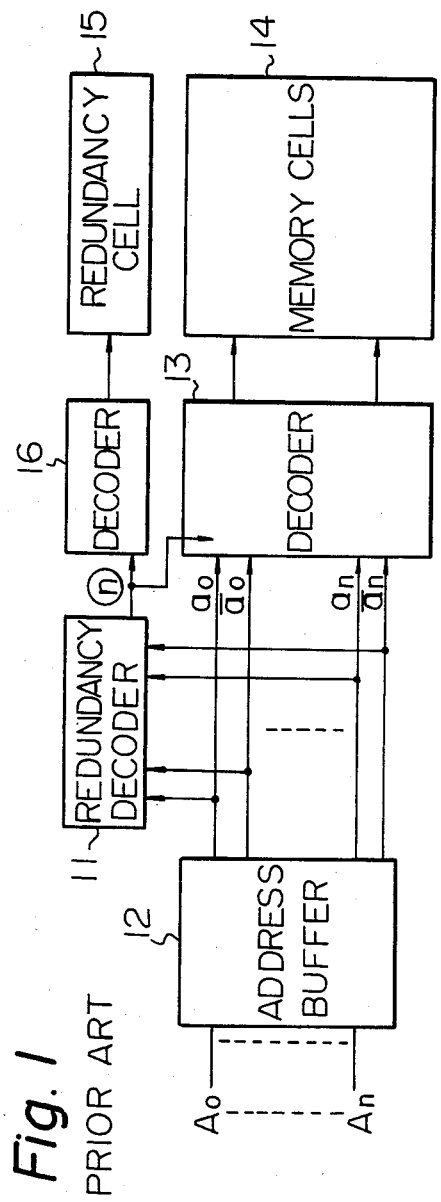
FIG. 1 is a block diagram of a usual semiconductor memory device including a redundancy decoder circuit.

FIG. 1 is a block diagram of a usual semiconductor memory device including a redundancy decoder circuit. In this figure, reference numeral 11 represents a redundancy decoder circuit to which the subject matter of the present invention relates. The redundancy decoder circuit 11 receives an address input which is branched from an address input $a_0$, $\bar{a}_0-a_n$, $\bar{a}_n$ to be applied, from an address buffer 12, to a decoder circuit 13. Reference characters $A_0-A_n$ denote an original address input supplied from, for example, a central processing unit (CPU). The decoder circuit 13 receives the address input $a_0$, $\bar{a}_0-a_n$, $\bar{a}_n$ and accesses the specified cell among memory cells 14 forming a memory cell array.

As previously mentioned, however it is impossible to guarantee that all memory cell arrays be manufactured without defective cells. Therefore, if a defective cell exists, its function is replaced by a redundancy cell 15. A decoder circuit cooperating with the redundancy cell 15 is indicated by reference numeral 16 shown in this figure. The decoder circuit 16 or 13 is selectively activated according to whether the address input specifies the defective cell. This activation is determined by a signal appearing at a portion ⓝ, the signal output from the redundancy decoder circuit 11.

If the address input accesses the defective cell, the address pattern of this input is decoded by the redundancy decoder circuit 11. Then, an output of logic "H" (high) appears at the portion ⓝ. This output of the "H" level deactivates the main decoder circuit 13 and activates the redundancy decoder circuit 16 to select the redundancy cell 15.

Figure 2:
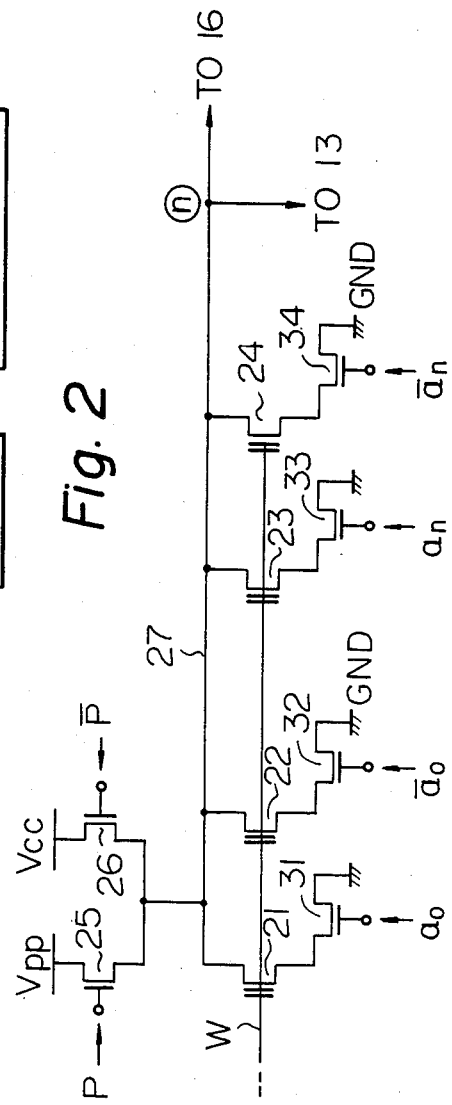
FIG. 2 is a circuit diagram of a circuit arrangement for realizing the redundancy decoder circuit 11 of FIG. 1.

FIG. 2 is a circuit diagram of an arrangement for realizing the redundancy decoder circuit 11 of FIG. 1. The circuit of FIG. 2 is one by which the inventors tried to realize a FAMOS redundancy decoder. The FAMOS redundancy decoder of FIG. 2, however, is not practical in use. In FIG. 2, reference numerals 21, 22, 23, and 24 represent enhancement type FAMOS transistors. To these FAMOS transistors, data "1" or "0" are written in advance according to an address pattern which corresponds to the address of the defective cell.

During a write mode, a signal P is changed to the "H" level (while a signal $\bar{P}$ is changed to the "L" (low) level). Therefore, a transistor 25 is turned on, while a transistor 26 is turned off. Here, a write voltage $V_{pp}$ of, for example, about 20 V, appears on a line 27. That is, the high voltage $V_{pp}$ appears at each drain of the FAMOS transistors 21 through 24. At this time, a high voltage of about 20 V is also applied to a word line W. Further, gate transistors 31, 32, 33, and 34 are connected to the FAMOS transistors 21 through 24, at corresponding sources. Thus, only the FAMOS transistors connected to the gate transistors which are on are in a write enable state. If the address pattern corresponding to the defective cell has a pattern of, for example, $(a_0, \bar{a}_0-a_n, \bar{a}_n)=(1, 0-1, 0)$ only the FAMOS transistors 21 and 23 are in the write enable state. That is, hot electrons are injected into each of the FAMOS transistors in the write enable state. The hot electrons are energized when drain currents flow, due to the high voltage $V_{pp}$, through the FAMOS transistors in the write enable state. This is because, since the control gates of these FAMOS transistors receive the high voltage supplied via the word line, the hot electrons are attracted to the control gates.

Figure 3:
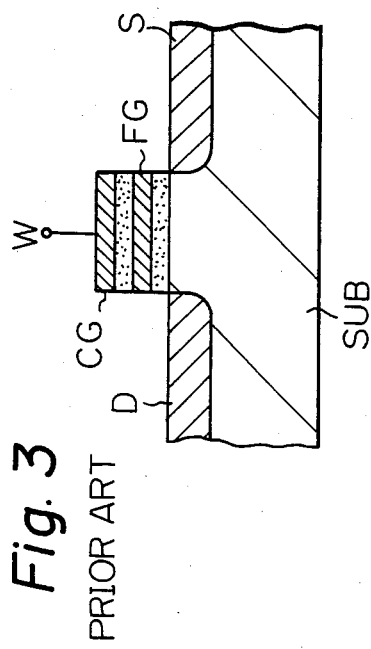
FIG. 3 is a cross-sectional view of a general structure of a usual FAMOS transistor.

FIG. 3 is a cross-sectional view of a general structure of a usual FAMOS transistor. In this figure, reference symbols S and D indicate the source and drain, respectively, both formed in a substrate SUB, the source S having the gate transistors 31 through 34 in FIG. 2 connected thereto and the drain D having the line 27 in FIG. 2 connected thereto. Reference symbol CG indicates the control gate which is connected to the word line W in FIG. 2. A floating gate FG is formed directly beneath the control gate CG and sandwiched by insulators.

Returning to FIG. 2 again, taking the aforementioned case as an example, data are written only in the FAMOS transistors 21 and 23. In other words, the electrons are injected only into the floating gates FG of the FAMOS transistors 21 and 23. Under such circumstance, each threshold level of these FAMOS transistors 21 and 23 increases and these transistors are transformed into seemingly normally-off transistors.

Thus, the address pattern identical to the address input for the defective cell is written, as a whole, into all the FAMOS transistors 21 through 24. The writing into the FAMOS transistors (when, in FIG. 2, the signal $\bar{P}$ is changed to "H", while the signal P is changed to "L") will be explained below, in which the memory actually achieves the access operation.

During the access operation, if the address input of, for example $(a_0, \bar{a}_0-a_n, \bar{a}_n)=(1, 0-1, 0)$ is supplied, the address input specifies the defective cell, the gate transistors 31 and 33 are turned on and the gate transistors 32 and 34 are turned off. However, as previously mentioned, the FAMOS transistors 21 and 23, which are respectively connected to the turned-on gate transistors 31 and 33, have changed to be normally off (it should be understood that about 3 V is now applied to the word line W), and, therefore, the paths between the line 27 and ground GND are all isolated. As a result, the level of the line 27 increases to the "H" level ($V_{cc}$ level). The "H" level forms the output appearing at the portion $\widehat{n}$, which deactivates the decoder circuit 13 and activates the decoder circuit 16. Thus, the redundancy cell 15 is selected.

With address patterns other than the pattern of $(a_0, \bar{a}_0-a_n, \bar{a}_n)=(1, 0-1, 0)$, at least one of the paths is always conductive. Therefore, the line 27 is maintained at the level of ground GND. That is, the "L" level output is always given to the portion $\widehat{n}$. Thus, the main decoder 13 is activated.

The problem with the redundancy decoder circuit of FIG. 2 resides in its reliability. According to the prior example, during the write mode, the write operations are conducted in the FAMOS transistors 21 and 23. In this case, the write operation may be unintentionally performed in any of the FAMOS transistors, other than FAMOS transistors 21 and 23, in which data is not to be written, even during a usual memory access mode other than the write operation mode.

Under a usual memory access mode, as previously mentioned, each of the FAMOS transistors receives, at its drain D, the voltage $V_{cc}$ (about 5 V) and, at its control gates CG, the voltage of about 3 V is supplied via the word line W. Under these conditions, injection of hot electrons into the floating gates FG cannot be guaranteed not to occur.

The reason for this may be considered to be the shortening of channels of the FAMOS transistors. The necessity for a redundancy decoder circuit arises from the high integration of the memory cells. In highly integrated memory cells, the channel length of each transistor is currently as short as approximately 2 μm. Consequently, there is a considerable chance of erroneous write operations.

An object of the present invention is generally to provide, as previously mentioned, a semiconductor memory device including a redundancy decoder circuit which is suitable for practical use, more specifically, to provide a redundancy decoder circuit in which almost all erroneous write operations are prevented.

Figure 4:
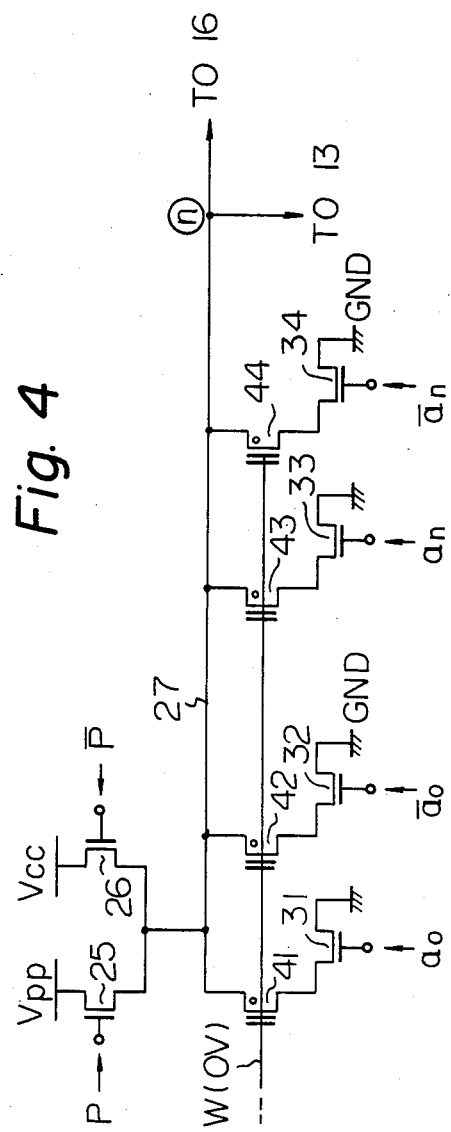
FIG. 4 is a circuit diagram of a redundancy decoder circuit according to an embodiment of the present invention.

FIG. 4 is a circuit diagram of a redundancy decoder circuit according to the present invention. In FIG. 4, members the same as those of FIG. 2 are represented by the same reference numerals or symbols. The differences lie in the use of transistors 41, 42, 43 and 44, which are all depletion-type FAMOS transistors (depletion type is symbolized by the small circle in each FAMOS transistor symbol, as shown in FIG. 4). In addition, ground level or lower (in this figure, referred to as "0 V") is applied to the word line W to which the control gates of the transistors 41 through 44 are commonly connected. It should be noted that 0 V is applied thereto only during the usual memory access mode. During the write operation, however, a voltage of approximately 20 V is applied thereto, as in FIG. 2.

The reasons for the differences of FIG. 4 as compared with FIG. 2 are as follows. Generally, hole and electron pairs are produced at a region close to the drain of each FAMOS transistor. Of the pairs, only the electrons are injected into the floating gate FG so that the write operation is performed therein. In this case, the injection is achieved by attraction of the electrons to the control gate CG having the positive voltage. Therefore, if the control gate CG is maintained, during the usual memory access mode, at ground level or lower, no injection of hot electrons to the floating gate can take place, regardless of whether the hot electrons exist at the region close to the drain. Consequently, under such conditions, no erroneous write operation occurs.

Thus, ground level or lower is applied to the word line W. It is practical to use the voltage of ground level rather than a lower voltage because the lower voltage level is optionally and externally supplied. Now, if the voltage of ground level is applied to the word line W and if the FAMOS transistors are all made of enhancement type FAMOS transistors as in FIG. 2, the desired operation would not be achieved. That is, in such a case, all the FAMOS transistors would be placed in the normally-off state during the usual memory access mode. With nonconductive transistors, the level at n would be charged to about the $V_{cc}$ level and, therefore, the main decoder circuit 13, available for the usual memory accessing, would be made nonactive. Accordingly, the FAMOS transistors must be of the depletion type, so that even when the voltage of ground level is applied to the word line, each FAMOS transistor in which data is written (having the floating gate in which the electrons are injected) is maintained in an off condition, while each FAMOS transistor in which no data is written (having no such electron injection) is maintained in an on condition.

This makes it possible to construct a redundancy decoder circuit which does not produce a write error, while maintaining the same function as in the circuit of FIG. 2, by introducing the FAMOS transistors 41 through 44 therein.

As explained above, according to the present invention, a redundancy decoder circuit which induces no write error can be realized. As a result, the reliability of a semiconductor memory device provided with such a redundancy decoder circuit can be increased.

We claim:

1. A semiconductor memory device, operatively connected to receive an address input signal, comprising:
   a memory cell array including memory cells;
   a decoder circuit, operatively connected to said memory cell array, for accessing a specified one of said memory cells in accordance with the address input signal;
   a redundancy memory cell, operatively connected to said decoder circuit, for replacing a defective memory cell in said memory cell array; and
   a redundancy decoder circuit, operatively connected to said decoder circuit, for receiving said address input signal and producing a selection signal for selecting said redundancy memory cell when the received address input signal corresponds to the address of the defective memory cell, said redundancy decoder circuit including a plurality of depletion-type FAMOS transistors, each of said FAMOS transistors being selected or non-selected in accordance with the selection signal and having a floating gate and a control gate, a write operation being performed in each of said selected FAMOS transistors by applying a predetermined voltage to said control gate of each of said FAMOS transistors and by injecting hot electrons into each said floating gate in dependence upon the predetermined voltage applied to said control gate, thereby inducing an electric field beneath the floating gate in a direction which repulses the hot electrons.

2. A semiconductor memory device as set forth in claim 1, wherein said predetermined voltage is set, during an operation mode other than said write operation mode, to ground level or lower.

3. A semiconductor memory device as set forth in claim 2, further comprising gate transistors having first and second side electrodes and gate electrodes and wherein each of said depletion-type FAMOS transistors having drains, the drains being commonly connected, the control gates being commonly connected, and having sources, respectively, serially connected to said gate transistors at the first side electrodes, the second side electrodes of said gate transistors being grounded, the gate electrodes receive the address input signal so as to make selected ones of said gate transistors conductive and the other said gate transistors nonconductive in accordance with the address input signal.

4. A semiconductor memory device, operatively connected to receive a write voltage and a power source voltage, as set forth in claim 3, wherein the commonly connected drains of said depletion type FAMOS transistors receive the write voltage during the write operation mode and the power source voltage during a memory access mode and, simultaneously, the control gates of said depletion type FAMOS transistors receive the predetermined voltage having ground level or lower.

5. A semiconductor memory device as set forth in claim 4, further comprising a transistor pair, operatively connected to the drains of said depletion-type FAMOS transistors, wherein the write voltage and the power source voltage are selectively applied to said transistor pair.

6. A semiconductor memory device as set forth in claim 1, wherein said predetermined voltage is ground level or lower and is applied only during a memory access mode operation.

7. A semiconductor memory device as set forth in claim 6, further comprising gate transistors, respectively, operatively connected to said depletion-type FAMOS transistors, for receiving the address input signal.

* * * * *

UNITED STATES PATENT AND TRADEMARK OFFICE
CERTIFICATE OF CORRECTION

PATENT NO. :   4,656,609
DATED      :   APRIL 7, 1987
INVENTOR(S):   MITSUO HIGUCHI ET AL.

It is certified that error appears in the above-identified patent and that said Letters Patent is hereby corrected as shown below:

Col. 2, line 18, "$\bar{a}_0 - a_n,$" should be --$\bar{a}_0$ --- $a_n,$--;

line 20, "$A_0 - A_n$" should be --$A_0$ --- $A_n$--;

line 23, "$\bar{a}_0 - a_n,$" should be --$\bar{a}_0$ --- $a_n,$--;

line 29, "cel" should be --cell--;

line 68, "$\bar{a}_0 - a_n,$" should be --$\bar{a}_0$ --- $a_n,$--;

line 68, "(1, 0-1, 0)" should be --(1, 0 --- 1, 0),--.

Col. 3, line 37, "$\bar{a}_0 - a_n,$" should be --$\bar{a}_0$ --- $a_n,$--;

line 37, "(1, 0-1, 0)" should be --(1, 0 --- 1, 0)--;

line 53, "$\bar{a}_0 - a_n,$" should be --$\bar{a}_0$ --- $a_n,$--;

line 53, "(1, 0-1, 0)," should be --(1, 0 --- 1, 0),--.

Col. 4, line 59, "n" should be --$\textcircled{n}$--.

Signed and Sealed this

Eighth Day of September, 1987

*Attest:*

DONALD J. QUIGG

*Attesting Officer*   *Commissioner of Patents and Trademarks*